US012328950B2

United States Patent
Yu et al.

(10) Patent No.: US 12,328,950 B2
(45) Date of Patent: Jun. 10, 2025

(54) PHOTOVOLTAIC CELL SHEET AND METHOD OF MANUFACTURING THE SAME AND TILE-STACKING MODULE

(71) Applicant: Huaneng Clean Energy Research Institute, Beijing (CN)

(72) Inventors: Xiangrui Yu, Beijing (CN); Wenbo Peng, Beijing (CN); Dongming Zhao, Beijing (CN); Ping Xiao, Beijing (CN); Ping Yang, Beijing (CN); Jin Ju, Beijing (CN)

(73) Assignee: HUANENG CLEAN ENERGY RESEARCH INSTITUTE, Beijing (CN)

( * ) Notice: Subject to any disclaimer, the term of this patent is extended or adjusted under 35 U.S.C. 154(b) by 0 days.

(21) Appl. No.: 18/043,612

(22) PCT Filed: Jun. 16, 2022

(86) PCT No.: PCT/CN2022/099173
§ 371 (c)(1),
(2) Date: Mar. 1, 2023

(87) PCT Pub. No.: WO2023/178847
PCT Pub. Date: Sep. 28, 2023

(65) Prior Publication Data
US 2024/0313138 A1    Sep. 19, 2024

(30) Foreign Application Priority Data

Mar. 23, 2022 (CN) .......................... 202210287806.8

(51) Int. Cl.
*H10F 19/40*    (2025.01)
*H10F 19/90*    (2025.01)
*H10F 71/00*    (2025.01)

(52) U.S. Cl.
CPC .......... *H10F 19/40* (2025.01); *H10F 19/902* (2025.01); *H10F 71/137* (2025.01)

(58) Field of Classification Search
None
See application file for complete search history.

(56) References Cited

U.S. PATENT DOCUMENTS

2018/0033902 A1* 2/2018 Caswell .......... H01L 31/035281
2018/0198008 A1* 7/2018 Tripp .................. H01L 31/0508
(Continued)

FOREIGN PATENT DOCUMENTS

CN    207320133 U      5/2018
CN    208422930 U  *   1/2019
(Continued)

OTHER PUBLICATIONS

Machine translation of CN110137284A (Year: 2019).*
(Continued)

*Primary Examiner* — Ryan S Cannon
(74) *Attorney, Agent, or Firm* — Hodgson Russ LLP

(57) ABSTRACT

The photovoltaic cell sheet includes: a cell sheet body having a first end and a second end opposite to each other in a width direction of the cell sheet body, wherein the first end of the cell sheet body is provided with a plurality of sawtooth spacing along a length direction of the cell sheet body; a first main gate arranged at one side of front and back sides of the plurality of sawtooth and serving as a first electrode; and a second main gate arranged at another side of the front and back sides of the cell sheet body and serving as a second electrode, wherein the second main gate is adjacent to the second end of the cell sheet body.

8 Claims, 4 Drawing Sheets

(56) References Cited

U.S. PATENT DOCUMENTS

2021/0328079 A1* 10/2021 Haque ................. H01L 31/0504
2021/0408313 A1* 12/2021 Lu ....................... H01L 31/0512

FOREIGN PATENT DOCUMENTS

| CN | 110137284 A | | 8/2019 | | |
|----|----|----|----|----|----|
| CN | 112447864 A | * | 3/2021 | ..... | H01L 31/022425 |
| CN | 112614905 A | * | 4/2021 | | |
| CN | 215220732 U | | 12/2021 | | |
| WO | WO-2021117740 A1 | * | 6/2021 | | |

OTHER PUBLICATIONS

Machine translation of CN-208422930-U (Year: 2019).*
CNIPA, First Office Action for CN Application No. 202210287806.8, Apr. 28, 2022.

* cited by examiner

PHOTOVOLTAIC CELL SHEET AND METHOD OF MANUFACTURING THE SAME AND TILE-STACKING MODULE

CROSS-REFERENCE TO RELATED APPLICATIONS

This application is a U.S. national phase application of International Application No. PCT/CN2022/099173, filed on Jun. 16, 2022, which claims priority to Chinese Patent Application No. 202210287806.8, filed on Mar. 23, 2022, the entire disclosures of which are incorporated herein by reference.

FIELD

The disclosure relates to the field of photovoltaic technology, in particular to a photovoltaic cell sheet and a method of manufacturing the same, and a tile-stacking module.

BACKGROUND

The tile stacking technology is an efficient photovoltaic module packing technology, with many advantages such as high Cell To Module (CTM) rate and strong resistance to local occlusion. However, due to the overlapping contact between the cell sheets required for connection of the cell sheets in the tile-stacking module, the cell sheets are shielded from each other, leading to reduced utilization of an effective area of the cell sheet. At present, the related technology to solve this problem is to reduce an overlap width between the cell sheets as much as possible to reduce overlap amounts between the cell sheets. However, this leads to significantly higher requirements for accuracy in printing gratings of the cell sheet and accuracy of module packing related equipment, which are difficult to achieve, difficult to guarantee quality control, and expensive.

SUMMARY

The disclosure directs to solve at least one of the technical problems in the above related background technology to a certain extent.

In view of the above, the disclosure provides in embodiments a photovoltaic cell sheet, with advantages such as low requirements for accuracy in printing gratings of the cell sheet and accuracy of module packing related equipment, high fault tolerance, low cost, and large effective area of the cell sheet.

In an aspect, the disclosure provides in embodiments a photovoltaic cell sheet, including:
  a cell sheet body, having a first end and a second end opposite to each other in a width direction of the cell sheet body, wherein the first end of the cell sheet body is provided with a plurality of sawtooth spacing along a length direction of the cell sheet body;
  a first main gate, arranged at one side of front and back sides of the plurality of sawtooth, and serving as a first electrode;
  a second main gate, arranged at another side of the front and back sides of the cell sheet body, and serving as a second electrode, wherein the second main gate is adjacent to the second end of the cell sheet body; and
  a plurality of sub-gates, arranged at the front and/or back sides of the cell sheet body, wherein the sub-gate is connected to the first main gate or the second main gate,
  wherein the photovoltaic cell sheet is manufactured by the following steps:
  printing a plurality of first main gate strips side-by-side on a front side of an original cell sheet, wherein the plurality of first main gate strips are spaced at an equal interval in a width direction of the original cell sheet, wherein each first main gate strip is provided with a first cutting line shaped as sawtooth and extending in a length direction of the original cell sheet;
  printing a plurality of second main gate strips side-by-side on a back side of the original cell sheet, wherein the plurality of second main gate strips are staggered with the plurality of first main gate strips at an equal interval in the width direction of the original cell sheet, wherein each second main gate strip is provided with a second cutting line shaped as a straight line and extending in the length direction of the original cell sheet;
  cutting the original cell sheet along the first cutting line such that the first main gate strip is divided into two sets of the first main gates disposed at the plurality of sawtooth; and
  cutting the original cell sheet along the second cutting line such that the second main gate strip is divided into two staggered sets of the second main gates,
  such that the photovoltaic cell sheet is formed with the plurality of the original cell sheets each having the same structure and shape.

According to embodiments of the disclosure, the photovoltaic cell sheet contributes to a reduced mutual occlusion area caused by overlapping between the cell sheets in a tile-stacking module, increased accuracy in printing gratings of the cell sheet and increased fault tolerance for the tile-stacking module related equipment, and reduced the difficulty and cost for manufacturing the tile-stacking module. The photovoltaic cell sheet is of advantages such as low requirements for accuracy in printing gratings of the cell sheet and accuracy of module packing related equipment, high fault tolerance, low cost, and large effective area of the cell sheet.

In some embodiments, the second main gates and the first main gates are equal in terms of numbers and correspond to each other one-to-one, and the second main gate and the corresponding first main gate are spaced in the width direction of the cell sheet body.

In some embodiments, the plurality of sub-gates arranged at the front and/or back sides of the cell sheet body are spaced along the length direction of the cell sheet body.

In some embodiments, the cell sheet body is further provided with an anti-break gate at the front and/or back sides with the sub-gates, and the anti-break gate extends along the length direction of the cell sheet body and is connected to the sub-gate at the same side of the cell sheet body.

In some embodiments, the cell sheet body is further provided with a marking point at the front and/or back sides, for calibration and alignment between the adjacent cell sheet bodies.

In some embodiments, the sawtooth is shaped as a rectangle extending along the length direction of the cell sheet body in a length direction of the sawtooth, wherein the plurality of sawtooth are spaced at an equal interval along the length direction of the cell sheet body, wherein a distance between two adjacent sawtooth is equal to a length of the sawtooth in the length direction of the cell sheet body.

In another aspect, the disclosure provides in embodiments a method of manufacturing a photovoltaic cell sheet, wherein the photovoltaic cell sheet manufactured includes:

a cell sheet body, having a first end and a second end opposite to each other in a width direction of the cell sheet body, wherein the first end of the cell sheet body is provided with a plurality of sawtooth spacing along a length direction of the cell sheet body;

a first main gate, arranged at one side of front and back sides of the plurality of sawtooth, and serving as a first electrode;

a second main gate, arranged at another side of the front and back sides of the cell sheet body, and serving as a second electrode, wherein the second main gate is adjacent to the second end of the cell sheet body; and a plurality of sub-gates, arranged at the front and/or back sides of the cell sheet body, wherein the sub-gate is connected to the first main gate or the second main gate, wherein the method of manufacturing the photovoltaic cell sheet includes the following steps:

printing a plurality of first main gate strips side-by-side on a front side of an original cell sheet, wherein the plurality of first main gate strips are spaced at an equal interval in a width direction of the original cell sheet, wherein each first main gate strip is provided with a first cutting line shaped as sawtooth and extending in a length direction of the original cell sheet;

printing a plurality of second main gate strips side-by-side on a back side of the original cell sheet, wherein the plurality of second main gate strips are staggered with the plurality of first main gate strips at an equal interval in the width direction of the original cell sheet, wherein each second main gate strip is provided with a second cutting line shaped as a straight line and extending in the length direction of the original cell sheet;

cutting the original cell sheet along the first cutting line such that the first main gate strip is divided into two sets of the first main gates disposed at the plurality of sawtooth; and cutting the original cell sheet along the second cutting line such that the second main gate strip is divided into two staggered sets of the second main gates, such that the photovoltaic cell sheet is formed with the plurality of the original cell sheets each having the same structure and shape.

In some embodiments, the method further includes: printing the plurality of sub-gates at the front and back sides of the original cell sheet, wherein at least some sub-gates at the front side of the original cell sheet are connected to the first main gate strip, and at least some sub-gates at the back side of the original cell sheet are connected to the second main gate strip.

In some embodiments, the method further includes: forming a first blank area separating the plurality of sub-gates and a second blank area separating the sub-gate and the first main gate strip at the front side of the original cell sheet, and forming a third blank area separating the plurality of sub-gates and a fourth blank area separating the sub-gate and the second main gate strip at the back side of the original cell sheet, wherein the first blank area is opposite to the fourth blank area, and the second blank area is opposite to the third area; and forming the first cutting line in the second blank area, and forming the second cutting line in the first area.

In another aspect, the disclosure provides in embodiments a tile-stacking module, including: a plurality of cell sheets each having sawtooth-shaped first end, wherein the cell sheet is the photovoltaic cell sheet of any of the above embodiments, wherein a first main gate is arranged at a front side of sawtooth, a second main gate is arranged at a back side of a cell sheet body, wherein the front side of sawtooth arranged at the first end of the cell sheet is connected in a tile-stacking way to the back side of the cell sheet body of the adjacent cell sheet.

REFERENCE

Figure 1:
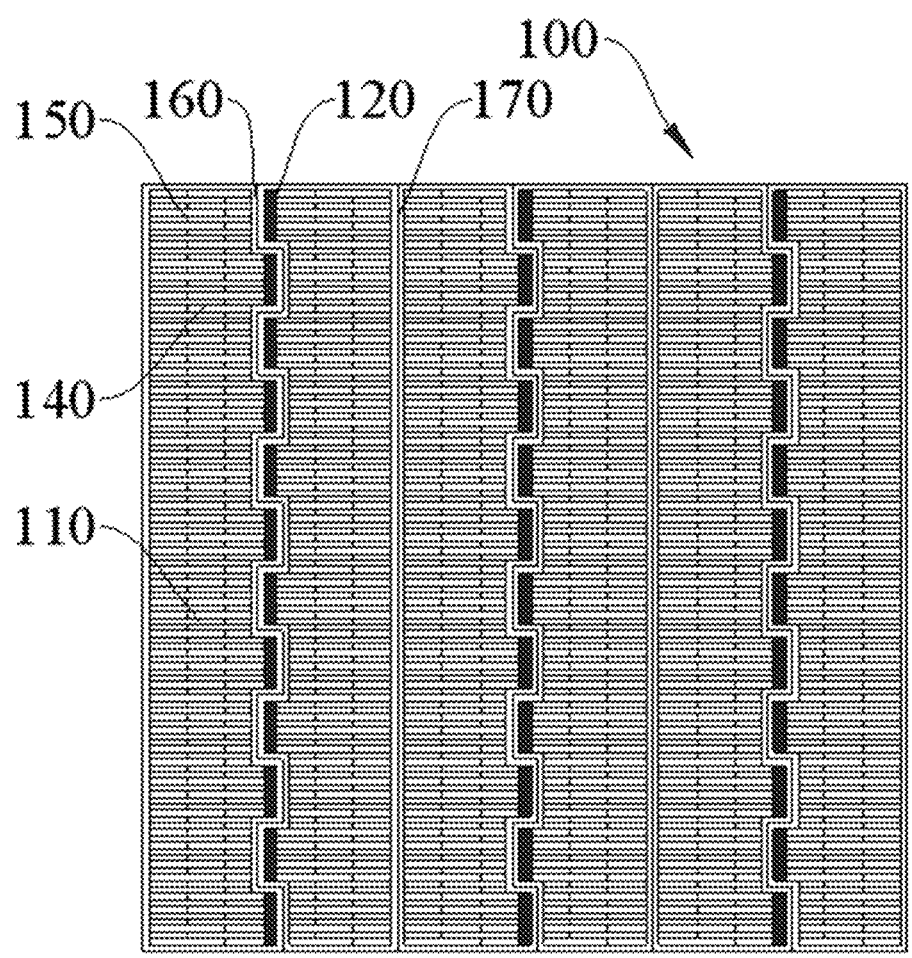
FIG. 1 is a schematic front view of an original cell sheet for a method of manufacturing a photovoltaic cell sheet in an embodiment of the disclosure.

100: original cell sheet; 110: cell sheet body; 111: sawtooth; 120: first main gate; 130: second main gate; 140: sub-gate; 150: anti-break gate; 160: first cutting line; 170: second cutting line; 180: marking point.

DETAILED DESCRIPTION

The embodiments of the disclosure are described below in detail, and examples for the embodiments are shown in the accompanied drawings. The embodiments described below with reference to the accompanied drawings are illustrative and are intended to explain the disclosure, but cannot be construed as restrictions on the disclosure.

In an aspect, the disclosure provides in embodiments a photovoltaic cell sheet. As shown in FIGS. 1 to 6, the photovoltaic cell sheet includes: a cell sheet body 110, having a first end and a second end opposite to each other in a width direction of the cell sheet body 110, wherein the first end of the cell sheet body 110 is provided with a plurality of sawtooth 111 spacing along a length direction of the cell sheet body 110; a first main gate 120, arranged at one side of front and back sides of the plurality of sawtooth 111, and serving as a first electrode; and a second main gate 130, arranged at another side of the front and back sides of the cell sheet body 110, and serving as a second electrode, wherein the second main gate 130 is adjacent to the second end of the cell sheet body 110. When the first main gate 120 is arranged at the front side of the plurality of sawtooth 111 of the cell sheet body 110, the second main gate 130 is arranged at the back side of the cell sheet body 110 and is adjacent to the second end of the cell sheet body, the first main gate 120 and the second main gate 130 each have the same length direction as the cell sheet body 110.

According to embodiments of the disclosure, the photovoltaic cell sheet contributes to a reduced mutual occlusion area caused by overlapping between the cell sheets in a tile-stacking module, increased accuracy in printing gratings of the photovoltaic cell sheet and increased fault tolerance for the tile-stacking module related equipment, and reduced difficulty and cost for manufacturing the tile-stacking module. The photovoltaic cell sheet is of advantages such as low requirements for accuracy in printing gratings of the cell sheet and accuracy of module packing related equipment, high fault tolerance, low cost, and large effective area of the cell sheet.

In some embodiments, as shown in FIGS. 1 to 6, the second main gates 130 and the first main gates 120 are equal in terms of numbers and correspond to each other one-to-one; and the second main gate 130 and the corresponding first main gate 120 are spaced in the width direction of the cell sheet body 110.

Accordingly, the second main gates 130 and the first main gates 120 are arranged in one-to-one correspondence, for convenience of unified printing at the cell sheet body 110, thus reducing the difficulty of printing at the cell sheet body 110. The second main gates 130 and the corresponding first main gates 120 are spaced in the width direction of the cell sheet body 110, thus contributing to the reduced occlusion area of the front and back sides of the cell sheet body 110 by the first main gates 120 and the second main gates 130, so that the cell sheet body 110 where none of the first main gates 120 and the second main gates 130 are printed will absorb light as usual for power generation.

Figure 2:
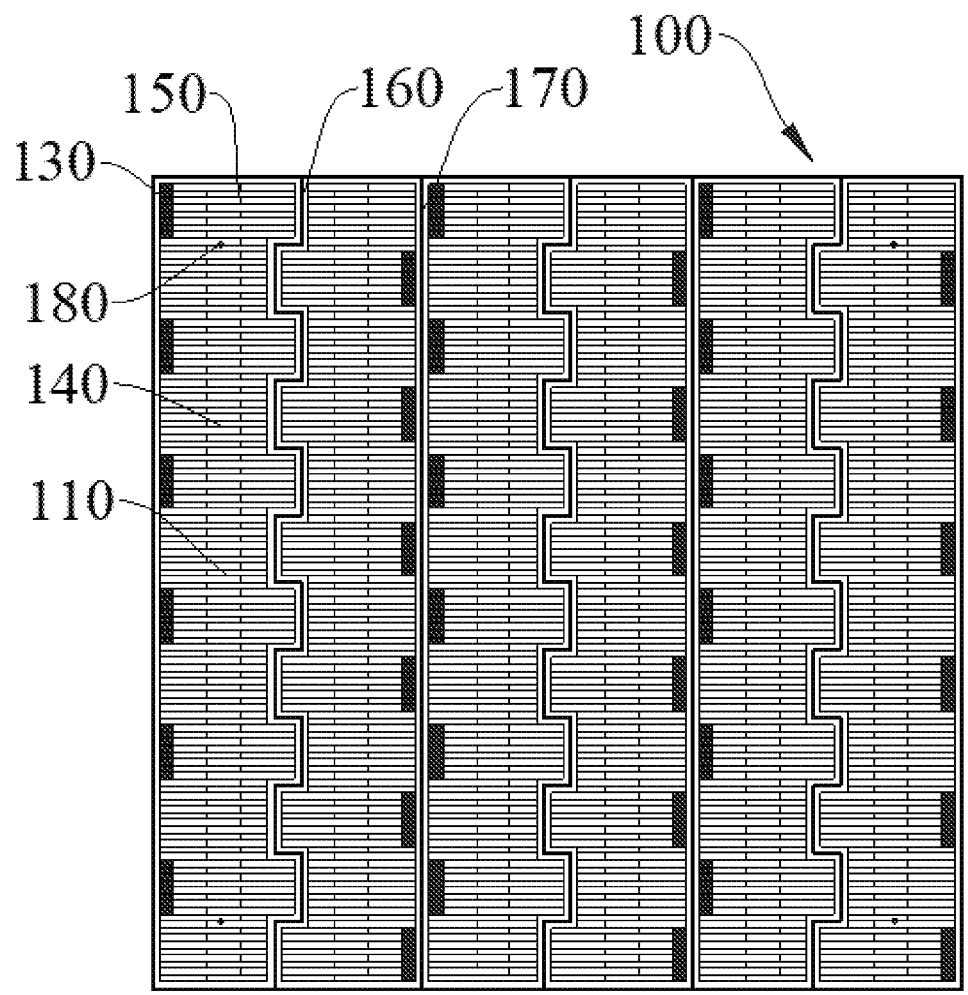
FIG. 2 is a schematic back view of an original cell sheet for a method of manufacturing a photovoltaic cell sheet in an embodiment of the disclosure.

In some embodiments, as shown in FIGS. 1 and 2, a plurality of sub-gates 140 are arranged at the front and/or back sides of the cell sheet body 110; and the plurality of sub-gates 140 arranged at the front and/or back sides of the cell sheet body 110 are spaced along the length direction of the cell sheet body 110.

Accordingly, the plurality of sub-gates 140 are spaced along the length direction of the cell sheet body 110 and connected to the first main gate 120 or the second main gate 130, so that the sub-gate 140 collects a charge from the cell sheet body 110 and conducts the charge to the first main gate 120 or the second main gate 130. The front and back sides of the cell sheet body 110 are provided with the plurality of sub-gates 140, thus contributing to better collection of the charge from the cell sheet body. The front or back side of the cell sheet body 110 is provided with the plurality of sub-gates 140, ensuring collection of the charge from the cell sheet body while reducing the occlusion area of the front or back side of the cell sheet body by the sub-gate 140, thereby improving the effective area of the cell sheet body 110.

In some embodiments, as shown in FIGS. 1 to 4, the cell sheet body 110 is provided with an anti-break gate 150 at the front and/or back sides with the sub-gates 140; and the anti-break gate 150 extends along the length direction of the cell sheet body 110 and is connected to the sub-gate 140 at the same side of the cell sheet body 110.

Accordingly, the anti-break gate 150 extends along the length direction of the cell sheet body 110 and perpendicularly to a direction along which the sub-gate 140 extends; and the anti-break gate 150 bridges adjacent sub-gates 140, so that the anti-break gate 150 ensures that the cell sheet body 110 is still connected to other adjacent sub-gates 140 or the main gate when the sub-gate 140 breaks unexpectedly. The anti-break gate 150 is provided for an increased fault tolerant rate of printing process and an improved yield of the cell sheet.

In some embodiments, as shown in FIG. 2, the cell sheet body 110 is provided with a marking point 180 at the front and/or back sides, for calibration and alignment between the adjacent cell sheet bodies 110.

Accordingly, the marking point 180 is provided for convenience of calibrating equipment to identify where the cell sheet is located, thus improving the efficiency of equipment to align the cell sheet.

Figure 3:
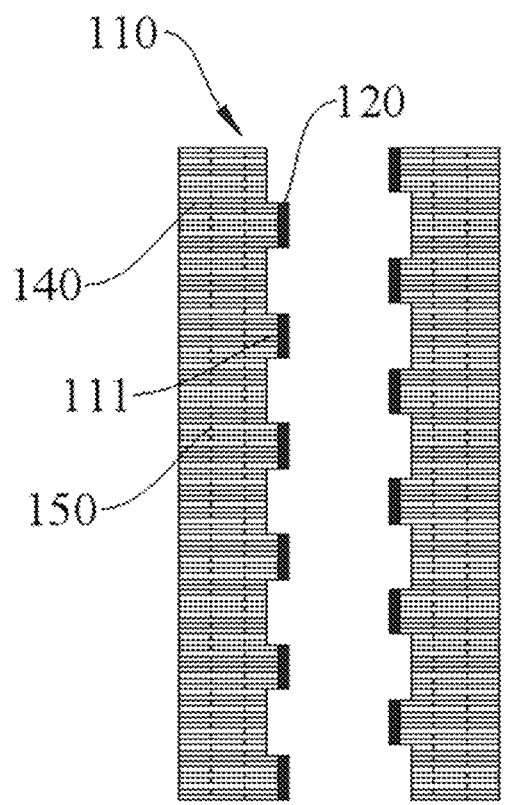
FIG. 3 is a schematic front view of a cell sheet body of a photovoltaic cell sheet in an embodiment of the disclosure.
Figure 4:
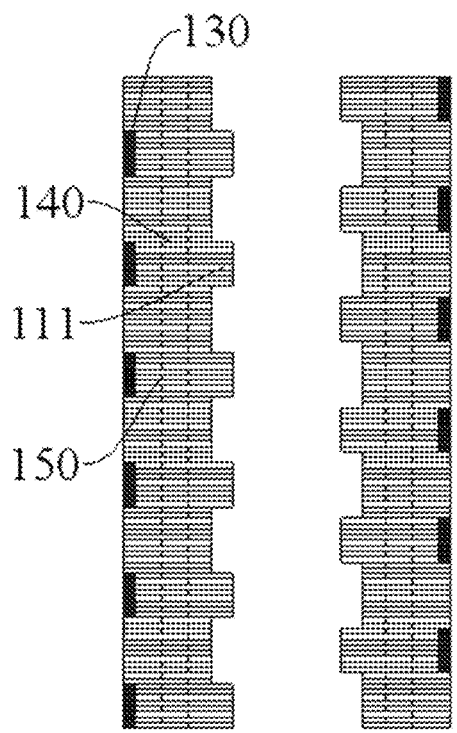
FIG. 4 is a schematic back view of a cell sheet body of a photovoltaic cell sheet in an embodiment of the disclosure.
Figure 5:
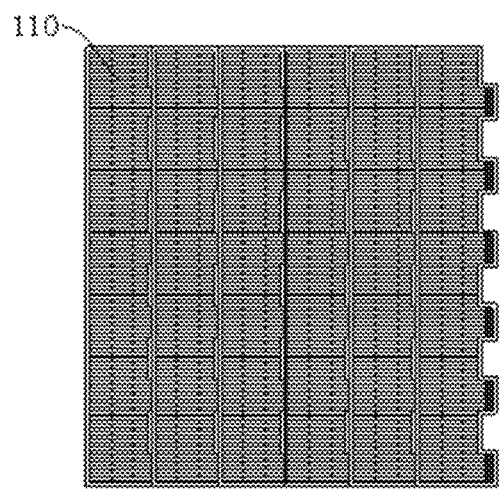
FIG. 5 is a schematic top view of a tile-stacking module in an embodiment of the disclosure.

In some embodiments, as shown in FIGS. 3 and 4, the sawtooth 111 is shaped as a rectangle extending along the length direction of the cell sheet body 110 in a length direction of the sawtooth 111; the plurality of sawtooth 111 are spaced at an equal interval along the length direction of the cell sheet body 110; and a distance between two adjacent sawtooth 111 is equal to a length of the sawtooth 111 in the length direction of the cell sheet body 110.

In specific, the sawtooth 111 of the cell sheet body 110 is shaped as a rectangle, with a long side connected to the first end of the cell sheet body 110; and the plurality of sawtooth 111 are spaced at an equal interval along the length direction of the cell sheet body 110, thereby reducing the processing difficulty of printing the first gate 120. Besides, the distance between two adjacent sawtooth 111 is equal to the length of the sawtooth 111 in the length direction of the cell sheet body 110, which facilitates processing and cutting of the cell sheet body 110.

In another aspect, the disclosure provides in embodiments a method of manufacturing a photovoltaic cell sheet. As shown in FIGS. 1 to 6, the method of manufacturing the photovoltaic cell sheet includes the following steps.

A plurality of first main gate strips are printed side-by-side on a front side of an original cell sheet 100. The plurality of first main gate strips are spaced at an equal interval in a width direction of the original cell sheet 100. Each first main gate strip is provided with a first cutting line 160 shaped as sawtooth. The first cutting line 160 extends in the length direction of the original cell sheet 100. The first cutting line 160 shaped as sawtooth is central symmetry.

A plurality of second main gate strips are printed side-by-side on a back side of the original cell sheet 100. The plurality of second main gate strips are staggered with the plurality of first main gate strips at an equal interval in the width direction of the original cell sheet 100. Each second main gate strip is provided with a second cutting line 170 shaped as a straight line and extending in the length direction of the original cell sheet 100.

The original cell sheet 100 is cut along the first cutting line 160 such that the first main gate strip is divided into two sets of the first main gates 120 disposed at the plurality of sawtooth 111. The original cell sheet 100 is then cut along the second cutting line 170 such that the second main gate strip is divided into two staggered sets of the second main gates 130. Accordingly, the photovoltaic cell sheet is formed with the plurality of the original cell sheets 100 each having the same structure and shape. The second main gates 130 of the second main gate strip are printed in sections. The number of the second cutting lines 170 is less than that of the first cutting lines 160, where the first cutting line 160 and the second cutting line 170 each are a scribing path to be used by scribing equipment in the process of scribing the photovoltaic cell, without operations required when printing gratings at the cell sheet.

According to embodiments of the disclosure, the technical advantages of the method of manufacturing the photovoltaic cell sheet are same as those of the photovoltaic cell sheet described above, which are not repeated here.

Figure 6:
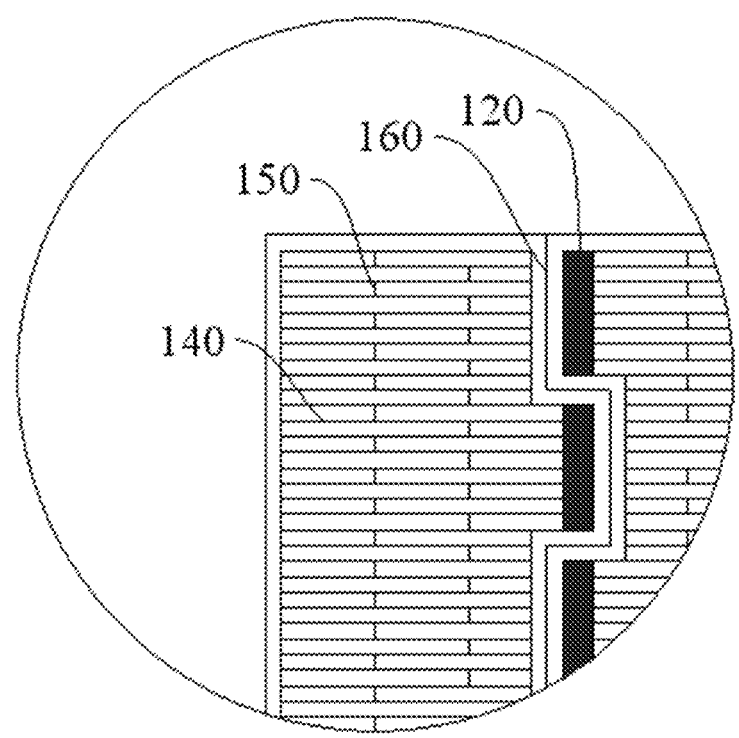
FIG. 6 is a schematic locally-enlarged view of an original cell sheet for a method of manufacturing a photovoltaic cell sheet in an embodiment of the disclosure.

In some embodiments, as shown in FIGS. 1, 2 and 6, the plurality of sub-gates 140 are printed at the front and back sides of the original cell sheet 100, where at least some sub-gates 140 at the front side of the original cell sheet 100 are connected to the first main gate strip, and at least some sub-gates 140 at the back side of the original cell sheet 100 are connected to the second main gate strip.

Accordingly, the sub-gate 140 is connected to the first main gate stripe to ensure that the first main gate 120 conducts the charge collected by the sub-gate 140; and the sub-gate 140 is connected to the second main gate stripe to ensure that the second main gate 130 conducts the charge collected by the sub-gate 140.

In some embodiments, as shown in FIGS. 1, 2 and 6, a first blank area separating the plurality of sub-gates 140 and a second blank area separating the sub-gate 140 and the first main gate strip are formed at the front side of the original cell sheet 100, and a third blank area separating the plurality of sub-gates 140 and a fourth blank area separating the sub-gate 140 and the second main gate strip are formed at the back side of the original cell sheet 100, where the first blank area is opposite to the fourth blank area, and the second blank area is opposite to the third area. The first cutting line 160 is formed in the second blank area, and the second cutting line 170 is formed in the first area.

In specific, the first blank area and the third blank area each separating the plurality of sub-gates 140 allow for protection of the sub-gates 140 during the scribing process; while the second blank area and the fourth blank area separating the sub-gate 140 and the first main gate strip or the second main gate strip also allow for protection of the sub-gates 140 during the scribing process. Once the original cell sheet 100 is cut, the first cutting line 160 is formed in the second blank area, and the second cutting line 170 is formed in the first blank area, where the first cutting line 160 divides the second blank area at the front side of the original cell sheet 100 and the third blank area at the back side of the original cell sheet 100, and the second cutting line 170 divides the first blank area at the front side of the original cell sheet 100 and the fourth blank area at the back side of the original cell sheet 100. In some embodiments, the number of the first cutting lines 160 is more than that of the second cutting lines 170. In a specific embodiment, the number of the first cutting lines 160 is one more than that of the second cutting lines 170.

In still another aspect, the disclosure provides in embodiments a tile-stacking module. As shown in FIGS. 1 to 6, the tile-stacking module includes: a plurality of cell sheets each having sawtooth-shaped first end, where the cell sheet is the photovoltaic cell sheet of any of the above embodiments. A first main gate 120 is arranged at a front side of sawtooth 111, a second main gate 130 is arranged at a back side of a cell sheet body 110, where the front side of sawtooth 111 arranged at the first end of the cell sheet is connected in a tile-stacking way to the back side of the cell sheet body 110 of the adjacent cell sheet.

According to embodiments of the disclosure, the technical advantages of the tile-stacking module are same as those of the photovoltaic cell sheet described above, which are not repeated here.

In the specification, it should be understood that, the terms indicating orientation or position relationship such as "central", "longitudinal", "lateral", "width", "thickness", "above", "below", "front", "rear", "right", "left", "vertical", "horizontal", "top", "bottom", "inner", "outer", "clockwise", "counter-clockwise", "axial", "radial" and "circumferential" should be construed to refer to the orientation or position relationship as then described or as shown in the drawings. These terms are merely for convenience and concision of description and do not alone indicate or imply that the device or element referred to must have a particular orientation or must be configured or operated in a particular orientation. Thus, it cannot be understood to limit the disclosure.

In addition, terms such as "first" and "second" are used herein for purposes of description and are not intended to indicate or imply relative importance or significance or impliedly indicate quantity of the technical feature referred to. Thus, the feature defined with "first" and "second" may explicitly or implicitly comprise at least one of this features. In the description of the disclosure, "a plurality of" means at least two of this features, such as two, three, etc., unless explicitly specified otherwise.

In the disclosure, unless specified or limited otherwise, the terms "mounted", "connected", "coupled", "fixed" and the like are used broadly, and may be, for example, fixed connections, detachable connections, or integrated connections; may also be mechanical or electrical connections; may also be direct connections or indirect connections via an intervening structure; may also be inner communications of two elements or mutual interaction between two elements, which can be understood by those skilled in the art according to specific situations.

In the disclosure, unless specified or limited otherwise, a structure in which a first feature is "on" or "below" a second feature may be an embodiment in which the first feature is in direct contact with the second feature, or an embodiment in which the first feature and the second feature are contacted indirectly via an intermediation. Furthermore, a first feature "on", "above" or "on top of" a second feature may include an embodiment in which the first feature is right or obliquely "on", "above" or "on top of" the second feature, or just means that the first feature is at a height higher than that of the second feature; while a first feature "below", "under" or "on bottom of" a second feature may include an embodiment in which the first feature is right or obliquely "below", "under" or "on bottom of" the second feature, or just means that the first feature is at a height lower than that of the second feature.

Reference throughout this specification to "an embodiment", "some embodiments", "one embodiment", "another example", "an example", "a specific example" or "some examples" means that a particular feature, structure, material, or characteristic described in connection with the embodiment or example is included in at least one embodiment or example of the disclosure. Thus, the appearances of the phrases such as "in some embodiments", "in one embodiment", "in an embodiment", "in another example", "in an example", "in a specific example" or "in some examples" in various places throughout this specification are not necessarily referring to the same embodiment or example of the disclosure. Furthermore, the particular features, structures, materials, or characteristics may be combined in any suitable manner in one or more embodiments or examples. In addition, those skilled in the art may combine different embodiments or examples and features in different embodiments or examples described in this specification without contradicting each other.

Although explanatory embodiments have been shown and described, it would be appreciated by those skilled in the art that the above embodiments cannot be construed to limit the disclosure, and changes, alternatives, and modifications can be made in the embodiments in the scope of the disclosure.

What is claimed is:

1. A method of manufacturing a photovoltaic cell sheet, wherein the photovoltaic cell sheet manufactured comprises:
a cell sheet body, having a first end and a second end opposite to each other in a width direction of the cell sheet body, wherein the first end of the cell sheet body is provided with a plurality of sawtooth spacing along a length direction of the cell sheet body;
a first main gate, arranged at the plurality of sawtooth and at a front side of the cell sheet body, and serving as a first electrode;

a second main gate, arranged at a back side of the cell sheet body, and serving as a second electrode, wherein the second main gate is adjacent to the second end of the cell sheet body; and a plurality of sub-gates, arranged at the front and/or back sides of the cell sheet body, wherein each sub-gate is connected to the first main gate or the second main gate, wherein the method of manufacturing the photovoltaic cell sheet comprises the following steps:

printing a plurality of first main gate strips side-by-side on a front side of an original cell sheet, wherein the plurality of first main gate strips are spaced at an equal interval in a width direction of the original cell sheet, wherein each first main gate strip is provided with a first cutting line shaped as a sawtooth and extending in a length direction of the original cell sheet, wherein each of the plurality of first main gate strips comprises the first main gates, and the first main gates are coaxially arranged along the length direction of the original cell sheet in sequence;

printing a plurality of second main gate strips side-by-side on a back side of the original cell sheet, wherein the plurality of second main gate strips are staggered with the plurality of first main gate strips at an equal interval in the width direction of the original cell sheet, wherein each second main gate strip is provided with a second cutting line shaped as a straight line and extending in the length direction of the original cell sheet, wherein each of the plurality of second main gate strips comprises the second main gates respectively arranged in a first vertical column and a second vertical column adjacent to the first vertical column, and the second main gates are alternately arranged along the length direction of the original cell sheet, with a sequence that alternates between the first and second vertical columns in a staggered pattern;

cutting the original cell sheet along the first cutting line such that the first main gate strip is divided into two sets of the first main gates disposed at the plurality of sawtooth; and cutting the original cell sheet along the second cutting line such that the second main gate strip is divided into two staggered sets of the second main gates, such that a plurality of the photovoltaic cell sheets are formed from the original cell sheet, with the plurality of the photovoltaic cell sheets each having the same structure and shape.

2. The method of manufacturing the photovoltaic cell sheet according to claim 1, wherein the second main gates and the first main gates are equal in terms of numbers and correspond to each other one-to-one at the same position in the length direction of the cell sheet body, and wherein each second main gate is spaced apart from the corresponding first main gate in the width direction of the cell sheet body.

3. The method of manufacturing the photovoltaic cell sheet according to claim 1, wherein the plurality of sub-gates arranged at the front and/or back sides of the cell sheet body are spaced along the length direction of the cell sheet body.

4. The method of manufacturing the photovoltaic cell sheet according to claim 1, wherein the cell sheet body is further provided with an anti-break gate at the front and/or back sides with the plurality of sub-gates, and wherein the anti-break gate extends along the length direction of the cell sheet body and is connected to the plurality of sub-gates at the same side of the cell sheet body.

5. The method of manufacturing the photovoltaic cell sheet according to claim 1, wherein the cell sheet body is further provided with a marking point at the front and/or back sides, for calibration and alignment between the adjacent cell sheet bodies.

6. The method of manufacturing the photovoltaic cell sheet according to claim 1,
wherein the sawtooth is shaped as a rectangle extending along the length direction of the cell sheet body in a length direction of the sawtooth,
wherein the plurality of sawtooth are spaced at an equal interval along the length direction of the cell sheet body,
wherein a distance between two adjacent sawtooth is equal to a length of the sawtooth in the length direction of the cell sheet body.

7. The method of manufacturing the photovoltaic cell sheet according to claim 1,
wherein the first cutting line is arranged at a second blank area, and the second cutting line is arranged at a first blank area.

8. A tile-stacking module, comprising: a plurality of cell sheets each having sawtooth-shaped first end, wherein each cell sheet is the photovoltaic cell sheet manufactured by the method as defined in claim 1, wherein the first main gate is arranged at the front side of the sawtooth, the second main gate is arranged at the back side of the cell sheet body, wherein the front side of the sawtooth arranged at the first end of each cell sheet is connected in a tile-stacking way to the back side of the cell sheet body of an adjacent cell sheet.

* * * * *